(12) United States Patent
De Jong et al.

(10) Patent No.: US 8,680,929 B2
(45) Date of Patent: Mar. 25, 2014

(54) LOW-1/F-NOISE LOCAL OSCILLATOR FOR NON-OVERLAPPING DIFFERENTIAL I/Q SIGNALS

(75) Inventors: Gerben W. De Jong, Veldhoven (NL); Dennis Jeurissen, Graz (AT)

(73) Assignee: ST-Ericsson S.A., Plan-les-Ouates (CH)

( * ) Notice: Subject to any disclaimer, the term of this patent is extended or adjusted under 35 U.S.C. 154(b) by 319 days.

(21) Appl. No.: 12/994,643

(22) PCT Filed: May 21, 2009

(86) PCT No.: PCT/IB2009/052133
§ 371 (c)(1),
(2), (4) Date: Mar. 13, 2011

(87) PCT Pub. No.: WO2009/144642
PCT Pub. Date: Dec. 3, 2009

(65) Prior Publication Data
US 2011/0164666 A1    Jul. 7, 2011

(30) Foreign Application Priority Data

May 27, 2008   (EP) ..................................... 08104102

(51) Int. Cl.
*H03B 27/00* (2006.01)
*H03K 3/017* (2006.01)
*H04B 1/40* (2006.01)

(52) U.S. Cl.
USPC ............. 331/45; 327/175; 327/233; 327/238; 327/239; 327/245; 327/247; 327/259; 455/209; 455/258; 455/318

(58) Field of Classification Search
USPC ......... 327/175, 231, 233–239, 243–247, 258, 327/259; 331/45; 455/208, 209, 258, 265, 455/318
See application file for complete search history.

(56) References Cited

U.S. PATENT DOCUMENTS 4,420,696 A * 12/1983 Gemma et al. ................ 327/239
5,532,633 A    7/1996 Kawai (Continued)

FOREIGN PATENT DOCUMENTS

WO   2007/104534 A1   9/2007
WO   2008/008759 A2   1/2008

OTHER PUBLICATIONS

EPO, Int'l Search Report in PCT/IB2009/052133, Dec. 4, 2009.

(Continued)

*Primary Examiner* — Levi Gannon
(74) *Attorney, Agent, or Firm* — Potomac Patent Group PLLC

(57) ABSTRACT

The present invention relates to a circuit arrangement (300) for generating non-overlapping and immune-to-1/f-noise signals as has been described. A break-before-make (BBM) circuit ensures that the differential I/Q signals (LO_0, LO_90, LO_180, LO_270), driving the transistors (M11, M12, M21, M22) of mixers (16A, 16B) in an RF receiver (200), are non-over-lapping for having at any time only one of these transistors turned on. The duty cycle of each driving signal is measured, and the difference (Δ) in the duty cycle corresponding to two subsequent LO phases is determined through a respective differential amplifier (38A-38D). Each differential amplifier is configured to have a current output (LT_0, LT_90, LT_180, LT_270), which is then fed back to the input of the input buffer (30A-30D) corresponding to the first LO phase in order to adjust its logic threshold (LT) level and make the difference (Δ) equal to zero. Thereby, the combined action of the BBM circuit and the feedback loops results in four non-overlapping differential I/Q signals (LO_0, LO_90, LO_180, LO_270) with constant and mutually equal duty cycles, and fixed and well-defined relative positions.

15 Claims, 6 Drawing Sheets

(56) References Cited

U.S. PATENT DOCUMENTS

| | | | |
|---|---|---|---|
| 6,084,452 A * | 7/2000 | Drost et al. | 327/175 |
| 7,298,193 B2 * | 11/2007 | Agarwal et al. | 327/175 |
| 7,330,059 B2 * | 2/2008 | Tai et al. | 327/158 |
| 7,612,620 B2 * | 11/2009 | Rausch et al. | 331/45 |
| 7,777,543 B2 * | 8/2010 | Park | 327/175 |
| 7,839,194 B2 * | 11/2010 | Chang et al. | 327/175 |
| 2005/0174156 A1 | 8/2005 | Wu et al. | |
| 2007/0090866 A1 * | 4/2007 | Park et al. | 327/175 |

OTHER PUBLICATIONS

EPO, Written Opinion in PCT/IB2009/052133, Dec. 4, 2009.
EPO, Int'l Preliminary Report on Patentability in PCT/IB2009/052133, Nov. 30, 2010.

* cited by examiner

LOW-1/F-NOISE LOCAL OSCILLATOR FOR NON-OVERLAPPING DIFFERENTIAL I/Q SIGNALS

FIELD OF THE INVENTION

The present invention relates to the field of communications, and more particularly to local oscillator signals.

BACKGROUND OF THE INVENTION

FIG. 1 depicts a conventional direct conversion or homodyne radio-frequency (RF) receiver 100, which may also be heterodyne and preferably low-IF heterodyne.

The antenna 10 converts the radio-frequency electromagnetic (EM) waves into an RF signal, which is first filtered by an RF band-pass filter (BPF) 12. The filtered signal is then amplified by a low-noise amplifier (LNA) 14 in order to increase the strength of the RF signal and reduce the noise Figure of the RF receiver 100. The LNA-amplified signal is next input into a frequency converter represented by the dashed line for being down-converted to baseband, using mixers 16A, 16B and orthogonal signals, i.e. in-phase (I) and quadrature (Q) signals, generated by a so-called local oscillator (LO) 18 and a 90-degree phase shifter (not represented). Each mixer 16A, 16B multiplies the LNA-amplified signal at its RF input with a periodic signal provided at its LO input by the LO 18, which is tuned to the carrier frequency of the desired RF signal. Each frequency-down-converted signal, also called intermediate-frequency (IF) signal, obtained at each IF output of mixers 16A, 16B is respectively filtered by a low-pass IF filter 20A, 20B before being amplified by a respective gain-controlled IF amplifier 22A, 22B. Usually, an IF filter 20A, 20B and its respective IF amplifier 22A, 22B are combined into a single building block as represented by the dashed lines. Each IF-amplified analog signal is then converted into a digital signal by a respective analog-to-digital converter (ADC) 24A, 24B, and the digital signal is afterwards demodulated by the digital baseband (BB) processor 26.

Several types of mixers can be used. However, when the mixers 16A, 16B are unbalanced or single balanced rather than double balanced, the CMOS frequency divider generating the I/Q LO signals produces a lot of 1/f-noise at the mixers outputs, and this is particularly harmful in case of a zero-IF or near-zero-IF receiver. The problem originates from the fact that the LO-signal generator comprises MOS transistors, which components are known to be 1/f-noisy. This causes relatively-slow random fluctuations of the duty cycle and pulse position of the I/Q LO signals generated by the CMOS frequency divider and then amplified by LO buffers. Indeed, a small fraction of the differential I/Q LO signals ends up at the RF input of the mixers 16A, 16B, due to crosstalk via parasitic capacitances around the mixer transistors. Ideally, the fundamental content of these signals exactly cancels out. However, in case of fluctuations and/or static differences in duty cycle and pulse position, a small residual part will be left at the RF input of the mixers 16A, 16B, and will be mixed down to the IF (self mixing). A static mutual deviation in duty cycle and pulse position would result in a DC component at the IF output of the mixers 16A, 16B. However, the deviations are not static but change over time due to the 1/f-noise, such that the IF signal is polluted by 1/f-noise.

SUMMARY OF THE INVENTION

It is therefore an object of the present invention to provide a low-1/f-noise local oscillator capable to generate non-overlapping differential I/Q signals.

This object is achieved by a circuit arrangement as claimed in claim 1, a local oscillator as claimed in claim 6, a radio receiver as claimed in claim 7, a method as claimed in claim 8, a computer program as claimed in claim 10, and an integrated circuit as claimed in claims 11 and 12.

In accordance with the present invention, there is provided a circuit arrangement for generating non-overlapping signals immune to 1/f-noise, the circuit arrangement comprising:
- a break-before-make circuit for generating non-overlapping signals, each of the non-overlapping signals having a subsequent phase and a duty cycle;
- a plurality of detectors for respectively measuring the duty cycle;
- a plurality of differential amplifiers for respectively determining a difference in the duty cycle corresponding to two subsequent phases and providing in output a result of the comparison;
- a plurality of buffers for making the difference equal to zero based on the result corresponding to the first phase amongst the two subsequent phases.

Thereby, the feedback loop made up of the association of a detector and a differential amplifier that feeds back its output to a respective buffer allows to have signals with constant and mutually equal duty cycles. Moreover, a well-defined and mutually equal non-overlap delay can be introduced by the break-before-make circuit, such that the combined action of the break-before-make circuit and the feedback loop allows to have non-overlapping signals not only with constant and mutually equal duty cycles, but also with fixed and well-defined relative positions.

Moreover, each buffer can have a logic threshold that is adjusted based on the result output by the respective differential amplifier and corresponding to the first phase amongst the two subsequent phases. Thereby, the switching instants of the buffer can change, such that the duty cycle of the output signal of the respective buffer can also be adjusted.

Furthermore, the result output by the respective differential amplifier can be in the form of a current. Thereby, a voltage across the output resistance of the stage or gate driving the respective buffer can be built up.

Additionally, the break-before-make circuit can comprise a plurality of NAND-gates, each NAND-gate corresponding to a phase of the subsequent phase. Thereby, the well-defined and mutually equal non-overlap delay can be the gate delay of each NAND-gate.

Also, each detector can be a low-pass filter. Thereby, the measured or detected duty cycle can be a low-frequency signal.

The present invention further extends to a local oscillator for generating driving signals, the local oscillator comprising the preceding circuit arrangement.

The present invention further extends to a radio receiver comprising at least a plurality of mixers, the mixers being driven by the driving signals generated by the preceding local oscillator.

In accordance with the present invention, there is provided a method of generating non-overlapping signals immune to 1/f-noise, the method comprising the steps of:
- generating non-overlapping signals, each of the non-overlapping signals having a subsequent phase and a duty cycle;
- measuring the duty cycle, respectively;
- determining a difference in the duty cycle corresponding to two subsequent phases, respectively;
- providing in output a result of the comparison;

making the difference equal to zero based on the result corresponding to the first phase amongst the two subsequent phases.

Additionally, the step of making the difference equal to zero can comprise adjusting a logic threshold based on the result output by the respective differential amplifier and corresponding to the first phase amongst the two subsequent phases.

The steps of the previous methods can be carried out by a computer program including program code means, when the computer program is carried out on a computer.

The present invention further extends to an integrated circuit comprising either the preceding circuit arrangement (300) or the preceding local oscillator (18).

BRIEF DESCRIPTION OF THE DRAWINGS

These and other aspects and advantages of the present invention will be apparent from and elucidated with reference to the embodiment(s) described hereinafter. In the following drawings.

DETAILED DESCRIPTION OF EMBODIMENTS

Figure 1:
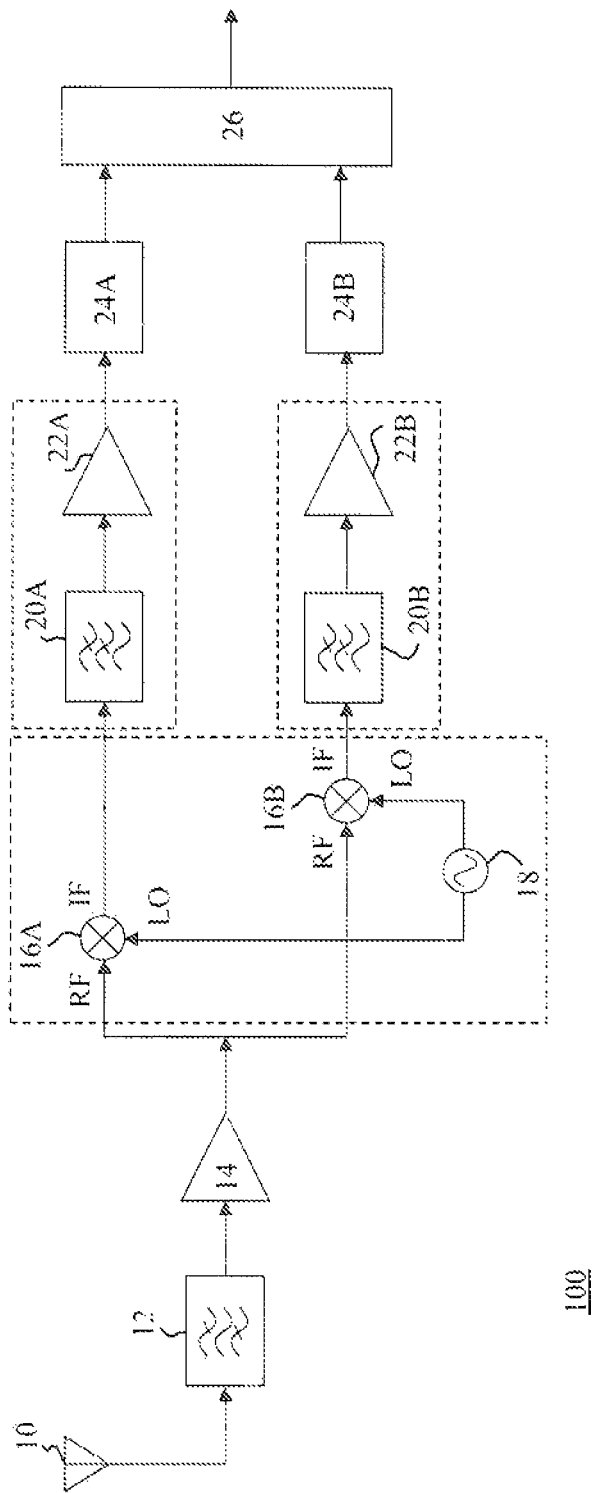
FIG. 1 shows a block diagram of a conventional RF receiver.
Figure 2:
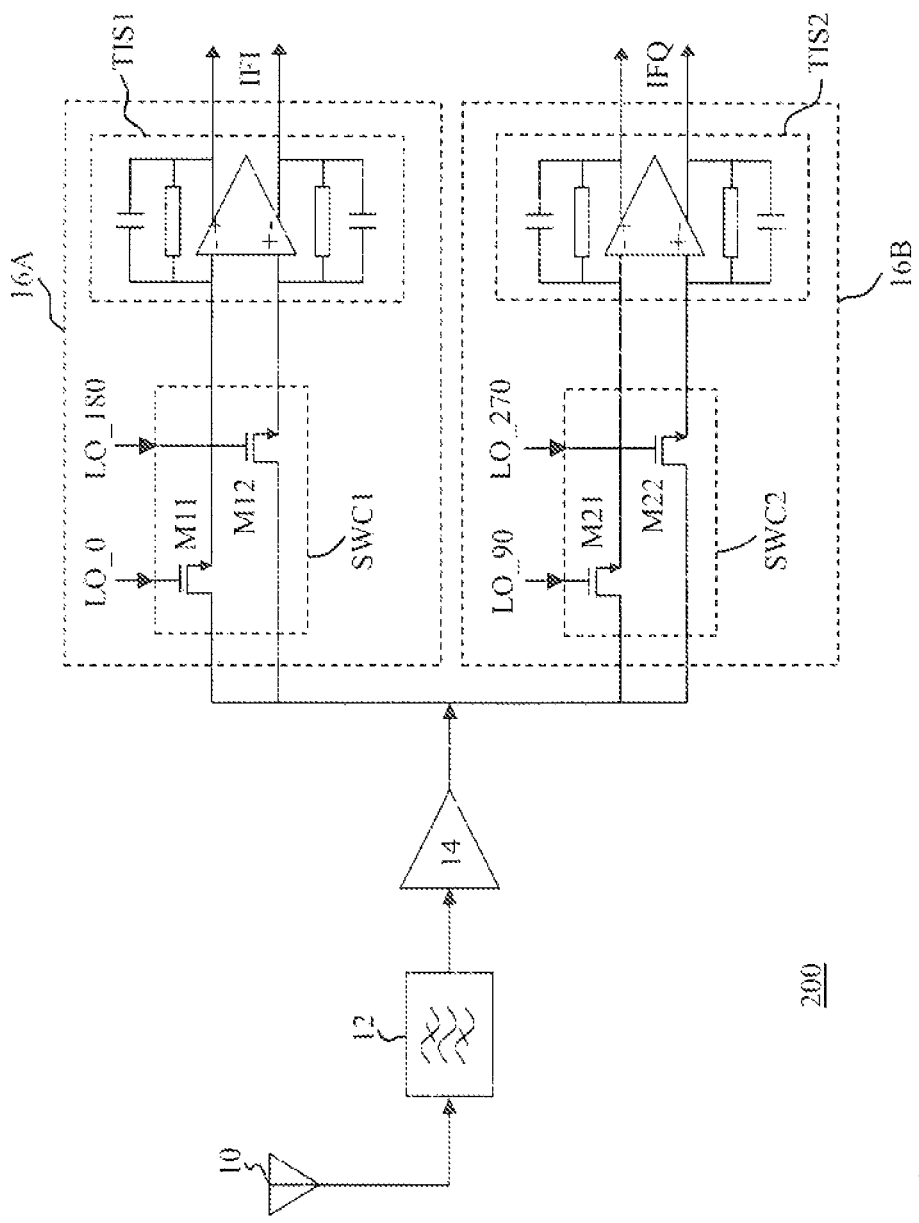
FIG. 2 shows a block diagram of an exemplary front-end of the RF receiver of FIG. 1, wherein both mixers are single-balanced passive CMOS mixers.

FIG. 2 shows an exemplary front-end 200 of the RF receiver 100 of FIG. 1, wherein both mixers 16A, 16B are single-balanced passive CMOS mixers.

Both mixers 16A, 16B together form a half-complex mixer, which mixes a complex balanced LO signal with a real unbalanced RF signal. The first mixer 16A is a in-phase mixer, which comprises a switch cell SWC1 coupled to a trans-impedance amplifier TIS1 and provides the in-phase component IFI of the IF signal. The second mixer 16B is a quadrature mixer, which comprises a switch cell SWC2 coupled to a trans-impedance amplifier TIS2 and provides the quadrature component IFQ of the IF signal. Each trans-impedance amplifier TIS1, TIS2 has a non-inverting input "+" and an inverting input "−". The switch cells SWC1 and SWC2 respectively comprise at least a pair of transistors (M11, M12) and (M21, M22), which may be gate-controlled switching devices, such as field effect transistors (FETs) for example. The pair of transistors (M11, M12) is directly driven by a pair of respective in-phase (I) signals, i.e. a non-inverting in-phase signal LO_0 and an inverting in-phase signal LO_180, each having a respective phase of 0° and 180°. The pair of transistors (M21, M22) is directly driven by a pair of respective quadrature (Q) signals, i.e. a non-inverting quadrature signal LO_90 and an inverting quadrature signal LO_270, each having a respective phase of 90° and 270°. The duty cycle of these differential I/Q signals LO_0, LO_90, LO_180, LO_270 will be chosen such that they do not overlap. In other terms, the switching sequence of the transistors M11-M22 will be determined in such a manner that, at any time, only one transistor, e.g. M11, will be turned on, the others, i.e. M12, M21, M22, being turned off, since two or more transistors turned on at the same time would result in serious noise boosting of the trans-impedance amplifiers TIS1, TIS2. Thus, the duty cycle of each differential I/Q signal LO_0, LO_90, LO_180, LO_270 should not exceed 25%.

Figure 3:
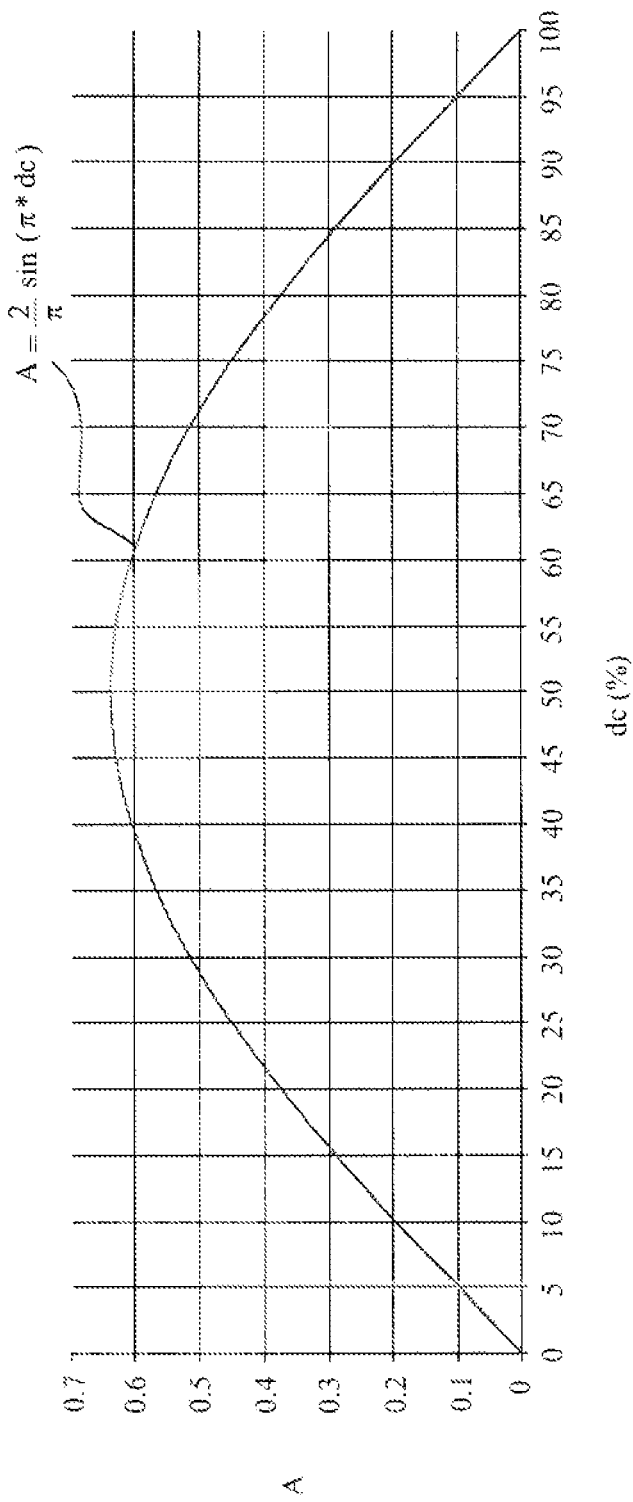
FIG. 3 shows a diagram that illustrates the fundamental (or first-harmonic) amplitude A of a $1V_{pp}$-amplitude binary signal versus its duty cycle dc according to the relation $A=(2/\pi)*\sin(\pi*dc)$.

FIG. 3 discloses the fundamental (or first-harmonic) amplitude A of a $1V_{pp}$-amplitude binary signal versus its duty cycle dc according to the relation $A=(2/\pi)*\sin(\pi*dc)$.

Thence, it can be observed that the slope of the curve is quite steep around 25%-duty cycle, such that duty cycle variations due to 1/f-noise will lead to substantial amplitude variations. These uncorrelated amplitude variations of the four differential I/Q signals LO_0, LO_90, LO_180, LO_270 will result in a non-perfect cancellation of the four crosstalk signals at the RF input of the mixers 16A, 16B. To the contrary, these duty cycle variations are almost absent in case the duty cycle is around 50%, since the tangent line to the curve at that value is roughly horizontal. Nevertheless, such a non-perfect cancellation when the duty cycle is around 50% can still occur, in the case of pulse-position variations.

However, by comparison with signals having a 50%-duty cycle, the signals having a 25%-duty cycle have the advantage that they can be used in I/Q receivers without LNA. In presence of LNA, they have also the advantage that this LNA only needs to have one current output, whereas two current outputs are needed in the case of signals with a 50%-duty cycle for avoiding any trans-impedance amplifier noise boosting.

Figure 4:
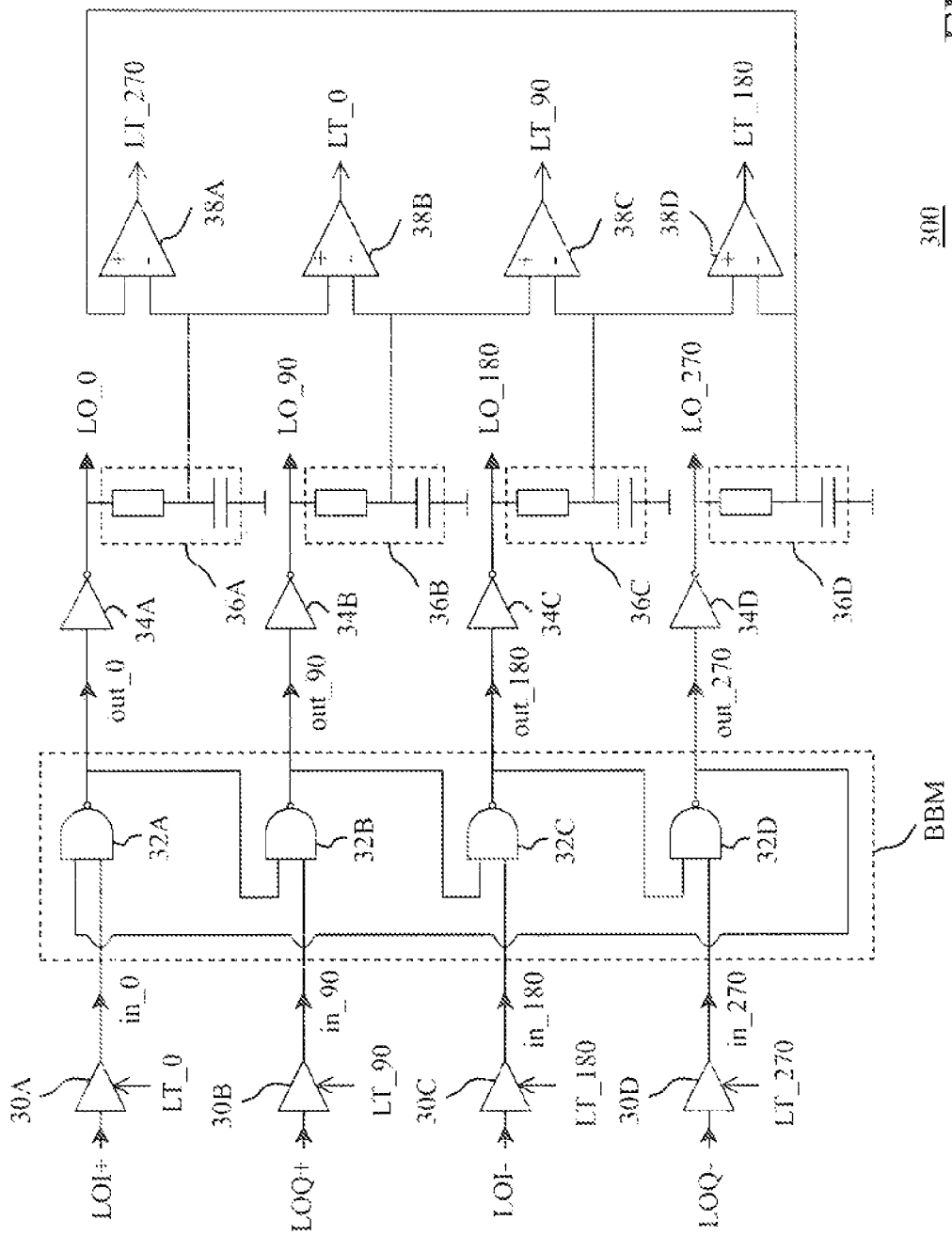
FIG. 4 shows a block diagram of a circuit arrangement for generating non-overlapping differential I/Q signals LO_0, LO_90, LO_180, LO_270, according to an embodiment of the present invention.

FIG. 4 illustrates a circuit arrangement 300 for generating non-overlapping differential I/Q signals LO_0, LO_90, LO_180, LO_270, according to an embodiment of the present invention.

Figure 5:
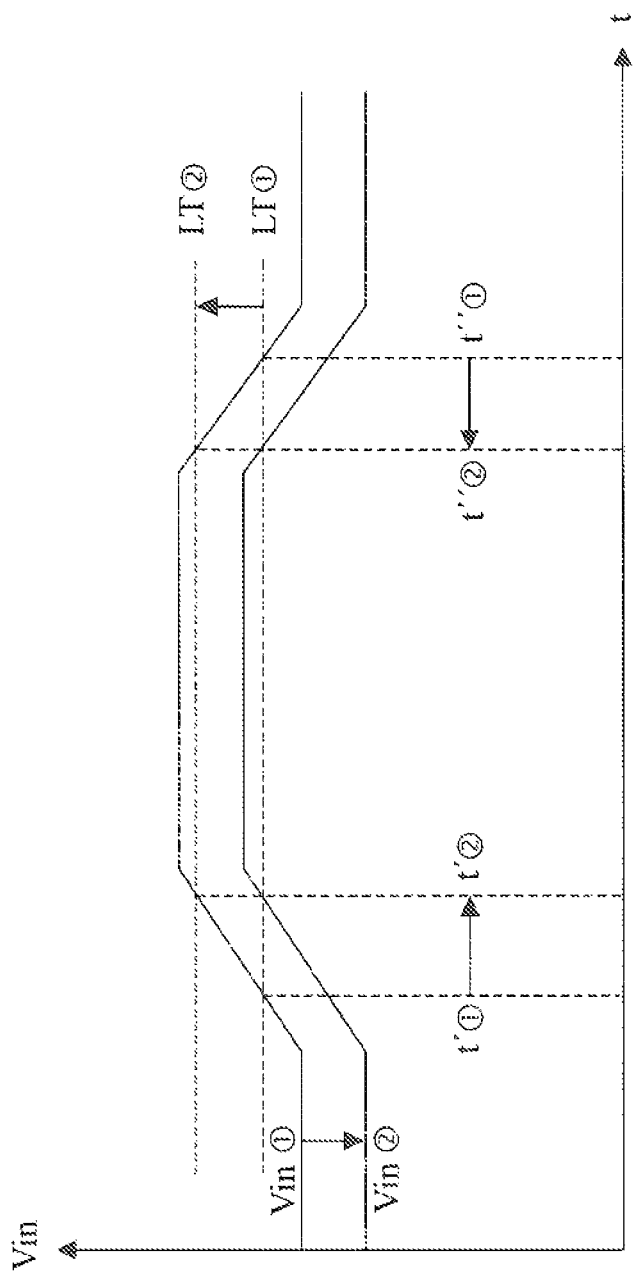
FIG. 5 shows a time diagram illustrating, for a buffer having non-zero rise and fall times, the effect of a shift of its logic threshold (LT) level or equivalently an offset of its input voltage Vin on the switching instants of this buffer.

Such a circuit arrangement 300 comprises input buffers 30A-30D, a break-before-make (BBM) circuit, output buffers 34A-34D, duty cycle detectors 36A-36D and differential amplifiers 38A-38D. Each input buffer 30A-30D is input by a respective differential I/Q LO signal LOI+, LOQ+, LOI−, LOQ−, each having a respective phase of 0°, 90°, 180° and 270° and a duty cycle less than 25% if non-overlapping and slightly greater than 25% if slightly overlapping (the preferred case), and can include a chain of tapered buffers or inverters, such as CMOS-inverters for example. Each output buffer 34A-34D can include a chain of tapered inverters and allows to directly drive a respective transistor M11-M22 such as depicted in FIG. 2, by outputting, at the corresponding LO input of the mixers 16A, 16B, a respective driving signal, namely a respective differential I/Q signal LO_0, LO_90, LO_180, LO_270. The BBM circuit has four inputs, each respectively supplied by an input signal in_0, in_90, in_180, in_270 and coupled to the output of the respective input buffers 30A-30D, and four outputs, each respectively providing an output signal out_0, out_90, out_180, out_270 and coupled to the input of the respective output buffers 34A-34D. It comprises as many NAND-gates as there are differential LO I/Q signals LOI+, LOQ+, LOI−, LOQ−, namely four NAND-gates 32A-32D. Moreover, since it exists an a priori information about the differential LO I/Q signals LOI+, LOQ+, LOI−, LOQ−, 2-input NAND-gates can be used rather than 4-input NAND-gates as it is required in the case of a full-blown generic BBM circuit. By comparison, the use of 2-input NAND-gates 32A-32D has the advantage to render the BBM circuit less complex and faster. The duty cycle of each differential I/Q signal LO_0, LO_90, LO_180, LO_270 is determined using a respective duty cycle detector 36A-36D, such as a first-order low-pass filter for example, which converts the detected duty cycle into a low-frequency signal, which is then provided to a respective differential amplifier 38A, 38B, 38C, 38D. To do so, each duty cycle detector 36A-36D has its input connected to the output of a respective output buffer 34A-34D, namely connected to a respective LO input of the mixers 16A, 16B, and its output commonly connected to the input of a pair of subsequent differential amplifiers 38A-38B, 38B-38C, 38C-38D, 38D-38A, in such a manner that, when a difference Δ in the duty cycle corresponding to two subsequent LO phases, namely 270° and 0°, 0° and 90°, 90° and 180° or 180° and 270°, is detected, this difference Δ is determined through the respective differential amplifier 38A-38D. Each differential amplifier 38A-38D is configured to have a current output LT_0, LT_90, LT_180, LT_270, which is then fed back to the input of the input buffer 30A-30D corresponding to the first LO phase in order to adjust its logic threshold (LT) level and make the difference Δ equal to zero. Indeed, the output current of the differential amplifiers 38A-38D builds up a voltage across the output resistance of the stage or gate driving the respective input buffer 30A-30D. As depicted in FIG. 5 wherein the input voltage Vin of a buffer has non-zero rise and fall times, this built-up voltage leads to an offset, from ① to ②, of its input voltage Vin downwards by a certain amount, without shifting its LT level. From another view, this can also be construed as shifting, from ① to ②, its LT level upwards by the same previous amount, without offsetting its input voltage Vin. In both cases, offsetting the input voltage Vin alone or shifting the LT level alone results in changing the switching instants t' and t'' from ① to ②, such that the duty cycle of the differential LO I/Q signals LOI+, LOQ+, LOI-, LOQ- can be adjusted. Thus, the input signals in_0, in_90, in_180, in_270 of the BBM circuit can have a duty-cycle value adjusted with respect to the differential LO I/Q signals LOI+, LOQ+, LOI-, LOQ-.

It is to be noted that the connection between the output of the differential amplifiers 38A-38D and the corresponding input buffers 30A-30D may also be made through a series resistor in order to reduce capacitive loading. Furthermore, in case the input buffers 30A-30D are formed of a chain of tapered buffers or inverters, the current output will be preferably connected to the most-left input of the chain in order to maximize the effect of the respective differential amplifiers 38A-38D by increasing the over-all loop-gain this way, which in turn is suitable for a large 1/f-noise suppression and static timing-error correction.

Figure 6:
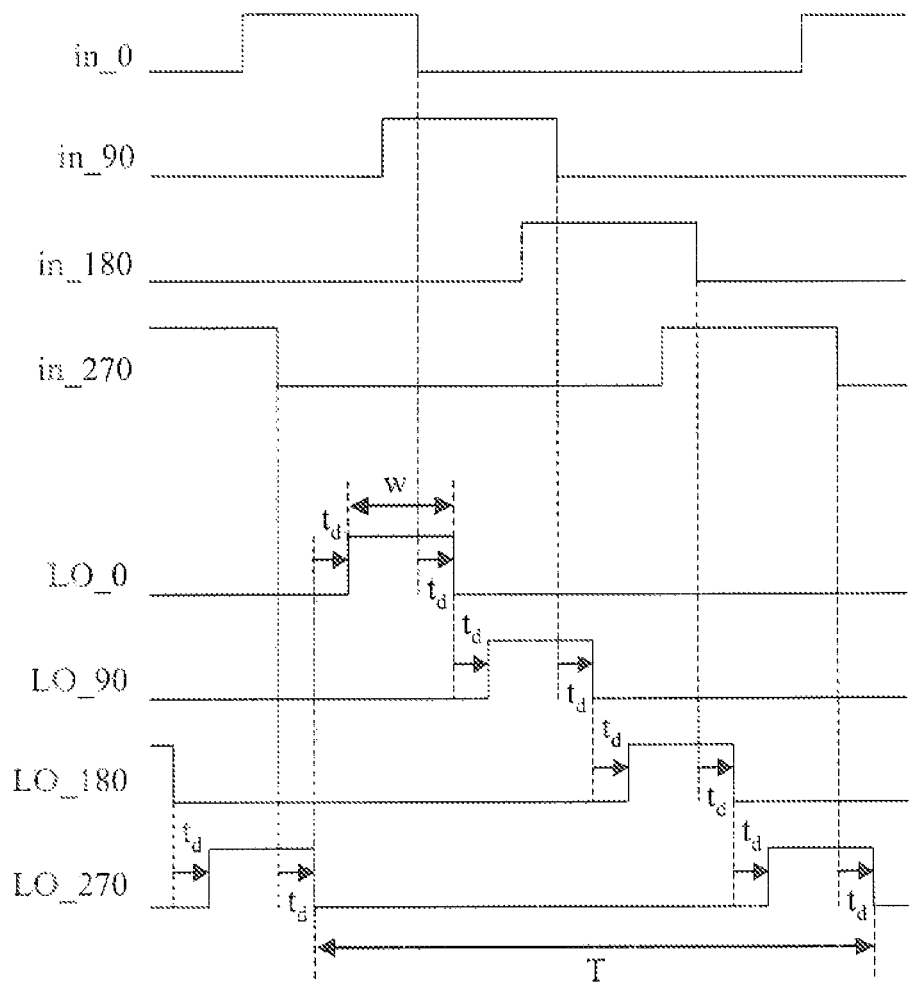
FIG. 6 depicts the waveforms of the input signals in_0, in_90, in_180, in_270 and differential I/Q signals LO_0, LO_90, LO_180, LO_270 of the circuit arrangement of FIG. 4, in the case that the input signals in_0, in_90, in_180, in_270 are overlapping.

FIG. 6 depicts the waveforms of the input signals in_0, in_90, in_180, in_270 and differential I/Q signals LO_0, LO_90, LO_180, LO_270 of the circuit arrangement of FIG. 4, in the case that the input signals in_0, in_90, in_180, in_270 are overlapping.

For clarity reasons, the input and output buffers 30A-30D, 34A-34D are assumed to be delay-less, since their gate delay is not essential for the operation of the BBM circuit, such that the differential I/Q signals LO_0, LO_90, LO_180, LO_270 directly driving the respective transistors M11-M22 of FIG. 2 exhibit the same but inverted waveforms as the output signals out_0, out_90, out_180, out_270 of the BBM circuit. The symbol $t_d$ represents the gate delay of each NAND-gate 32A-32D, and w represents the pulse width, namely the product of duty cycle and period, of each differential I/Q signal LO_0, LO_90, LO_180, LO_270.

As can be seen from FIG. 6, the gate delay $t_d$ also determines the exact gap between the trailing edge of an differential I/Q signal LO_0, LO_90, LO_180, LO_270 corresponding to a given LO phase and the leading edge LO_0, LO_90, LO_180, LO_270 of the differential I/Q signal corresponding to the next LO phase. Indeed, the gate delay $t_d$ determines the time interval of non-overlap of the differential I/Q signals LO_0, LO_90, LO_180, LO_270, in case the input signals in_0, in_90, in_180, in_270 are overlapping by an amount equal to or greater than the gate delay $t_d$. When the input signals in_0, in_90, in_180, in_270 do not overlap or overlap by an amount lower than the gate delay $t_d$, the BBM circuit does not modify the differential I/Q signals LO_0, LO_90, LO_180, LO_270 apart from adding some delay imposed by itself.

Furthermore, it can be observed that as long as the input signals in_0, in_90, in_180, in_270 are overlapping, only the positions of their trailing edges affect the differential I/Q signals LO_0, LO_90, LO_180, LO_270, the positions of their leading edges being irrelevant. If, for example, the trailing edge of the input signal in_90 is shifted towards the right by acting on the LT level of the input buffer 30B, then the trailing edge of the differential I/Q signal LO_90 will be also shifted towards the right, thus increasing its duty cycle. In turn, the shifted position of this trailing edge will shift towards the right the leading edge of the differential I/Q signal LO_180, thus decreasing its duty cycle. It is the reason why, in this example, the differential amplifier 38C that determines the duty cycle difference A corresponding to the pair of LO phases 90° and 180° regulates through its output the input buffer 30B corresponding to the LO phase 90°, namely corresponding to the first LO phase amongst the two issued from the pair. This particular example applies more generally to the other subsequent LO phases (270°, 0°), (0°, 90°), (180°, 270°). Indeed, changing the LT level of the input buffers 30A-30D in the circuit arrangement 300 of FIG. 4 allows guaranteeing that the pulse width w, and therefore the duty cycle, of each differential I/Q signal LO_0, LO_90, LO_180, LO_270 is constant and mutually equal. Moreover, in conjunction with the BBM circuit that provides, through its NAND-gates 32A-32D, a well-defined and mutually equal non-overlap delay $t_d$, the circuit arrangement 300 contributes to guarantee that the relative quadrature position of the differential I/Q signals LO_0, LO_90, LO_180, LO_270 is also well defined and fixed, for example when signals in_0, in_90, in_180, in_270 are overlapping and are applied at the inputs of the BBM circuit. In fact, it can be seen from FIG. 6 that the distance between corresponding edges of two subsequent differential I/Q signals, i.e. between LO_0 and LO_90, LO_90 and LO_180, LO_180 and LO_270, LO_270 and LO_0, is equal to (w+$t_d$), such that if T represents the LO period, then T=4*(w+$t_d$) and the pulse width w can be defined as mutually equal to (T/4−$t_d$).

Thus, the association of a duty cycle detector 36A-36D with a differential amplifier 38A-38D configured to have a current output LT_0, LT_90, LT_180, LT_270 that is fed back to the input of a respective input buffer 30A-30D constitutes a feedback loop for each LO phase 0°, 90°, 180°, 270°, and the combined action of the BBM circuit and each feedback loop results in four non-overlapping output signals out_0, out_90, out_180, out_270 with constant and mutually equal duty cycles, and fixed and well-defined relative positions. As mentioned above, the four non-overlapping differential I/Q signals LO_0, LO_90, LO_180, LO_270 also exhibit the same but inverted waveforms as these output signals out_0, out_90, out_180, out_270, namely they have also constant and mutually equal duty cycles, and fixed and well-defined relative positions. Thereby, the circuit arrangement 300 when applied as local oscillator can provide IF signals immune to pollution with 1/f-noise and without any DC component.

The embodiment of the present invention has been described in the case of a single RF receiver pipe. In another embodiment, a plurality of RF receiver pipes can be used, the selection being carried out, for example, by a NAND-gate located at the input of each input buffer 30A-30D.

Applications contemplated for such circuit arrangement 300 include any radio receivers, and in particular multi-band/multi-mode/multi-standard radio receivers, software-defined radio (SDR) receivers, radio receivers for broadcast, radio receivers for cellular (GSM, EDGE, UMTS, 4G) and connectivity (WPAN, BlueTooth, WLAN) applications, co-existence applications, etc.

In summary, a circuit arrangement 300 for generating non-overlapping and immune-to-1/f-noise signals has been described. A break-before-make (BBM) circuit ensures that the differential I/Q signals LO_0, LO_90, LO_180, LO_270, driving the transistors M11, M12, M21, M22 of mixers 16A, 16B in an RF receiver 200, are non-overlapping for having at any time only one of these transistors turned on. The duty cycle of each driving signal is measured, and the difference $\Delta$ in the duty cycle corresponding to two subsequent LO phases is determined through a respective differential amplifier 38A-38D. Each differential amplifier is configured to have a current output LT_0, LT_90, LT_180, LT_270, which is then fed back to the input of the input buffer 30A-30D corresponding to the first LO phase in order to adjust its logic threshold (LT) level and make the difference $\Delta$ equal to zero. Thereby, the combined action of the BBM circuit and the feedback loops results in four non-overlapping differential I/Q signals LO_0, LO_90, LO_180, LO_270 with constant and mutually equal duty cycles, and fixed and well-defined relative positions.

While the present invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. A single or other unit may fulfil the functions of several items recited in the claims. The mere fact that certain measures are recited in mutually different dependent claims does not indicate that a combination of these measures cannot be used to advantage.

A computer program may be stored/distributed on a suitable medium, such as an optical storage medium or a solid-state medium supplied together with or as part of other hardware, but may also be distributed in other forms, such as via the Internet or other wired or wireless telecommunication systems.

Finally, any reference signs in the claims should not be construed as limiting the scope.

The invention claimed is:

1. A circuit arrangement for generating non-overlapping signals having low 1/f-noise, comprising:
   a break-before-make circuit configured to generate a plurality of non-overlapping signals, each non-overlapping signal having a respective duty cycle and a respective phase that is successive of the phase of another one of the non-overlapping signals;
   a plurality of detectors, each detector configured to measure the duty cycle of a respective non-overlapping signal;
   a plurality of differential amplifiers, each differential amplifier configured to determine a respective difference between the duty cycles of non-overlapping signals having successive phases and to output a respective result; and
   a plurality of buffers corresponding to the plurality of differential amplifiers, each buffer configured to receive a respective non-overlapping signal and an output of a respective differential amplifier and to make a respective difference equal to zero based on the corresponding respective result.

2. The circuit arrangement of claim 1, wherein each buffer has a logic threshold that is adjusted based on the respective result.

3. The circuit arrangement of claim 1, wherein a result has a form of a current.

4. The circuit arrangement of claim 1, wherein the break-before-make circuit comprises a plurality of NAND-gates, each NAND-gate corresponding to a respective one of the phases.

5. The circuit arrangement of claim 1, wherein a detector includes a low-pass filter.

6. The circuit arrangement of claim 1, wherein the circuit arrangement is configured as a local oscillator for generating driving signals.

7. The circuit arrangement of claim 6, wherein the local oscillator is included in a radio receiver having a plurality of mixers driven by the driving signals.

8. The circuit arrangement of claim 6, wherein the circuit arrangement is further configured as an integrated circuit.

9. The circuit arrangement of claim 1, wherein the circuit arrangement is configured as an integrated circuit.

10. A method of generating non-overlapping signals having low 1/f-noise, comprising:
    generating a plurality of non-overlapping signals, each non-overlapping signal having a respective duty cycle and a respective phase that is successive of the phase of another one of the non-overlapping signals;
    measuring the respective duty cycles;
    determining respective differences between the duty cycles of non-overlapping signals having successive phases;
    outputting respective results of determining the differences; and
    making the differences equal to zero based on the corresponding respective results.

11. The method of claim 10, wherein making a difference equal to zero comprises adjusting a logic threshold based on the respective result.

12. The method of claim 10, wherein measuring a respective duty cycles comprises low-pass filtering the respective non-overlapping signal.

13. A program product stored on a computer-readable medium comprising non-transitory instructions that, when executed by a computer, carry out a method of generating non-overlapping signals having low 1/f-noise, wherein the method comprises:
    generating a plurality of non-overlapping signals, each non-overlapping signal having a respective duty cycle and a respective phase that is successive of the phase of another one of the non-overlapping signals;
    measuring the respective duty cycles;

determining respective differences between the duty cycles of non-overlapping signals having successive phases;

outputting respective results of determining the differences; and making the differences equal to zero based on the corresponding respective results.

14. The medium of claim 13, wherein making a difference equal to zero comprises adjusting a logic threshold based on the respective result.

15. The medium of claim 13, wherein measuring a respective duty cycle comprises low-pass filtering the respective non-overlapping signal.

* * * * *